(12) United States Patent
Kuhn et al.

(10) Patent No.: US 8,258,057 B2
(45) Date of Patent: Sep. 4, 2012

(54) COPPER-FILLED TRENCH CONTACT FOR TRANSISTOR PERFORMANCE IMPROVEMENT

(75) Inventors: Kelin J. Kuhn, Aloha, OR (US); Kaizad Mistry, Lake Oswego, OR (US); Mark Bohr, Aloha, OR (US); Chris Auth, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 648 days.

(21) Appl. No.: 11/396,201

(22) Filed: May 23, 2006

(65) Prior Publication Data

US 2007/0273042 A1 Nov. 29, 2007

(51) Int. Cl.
*H01L 21/4763* (2006.01)

(52) U.S. Cl. ........ 438/637; 438/622; 438/627; 438/687; 257/E21.585; 257/758; 257/762

(58) Field of Classification Search .................. 257/763, 257/344, 762, E21.585, E21.586, E23.019; 438/643, 622, 619, 637, 627
See application file for complete search history.

(56) References Cited

U.S. PATENT DOCUMENTS

| | | | | |
|---|---|---|---|---|
| 4,837,609 A * | 6/1989 | Gurvitch et al. | ................ | 257/43 |
| 5,124,780 A * | 6/1992 | Sandhu et al. | ................ | 257/344 |
| 5,354,712 A | 10/1994 | Ho et al. | | |
| 5,899,740 A * | 5/1999 | Kwon | .......................... | 438/627 |
| 5,985,749 A * | 11/1999 | Lin et al. | ....................... | 438/623 |
| 6,037,248 A * | 3/2000 | Ahn | ............................. | 438/619 |
| 6,121,129 A * | 9/2000 | Greco et al. | ................... | 438/622 |
| 6,352,920 B1 * | 3/2002 | Shimomura | .................. | 438/637 |
| 6,440,830 B1 * | 8/2002 | Lopatin | ......................... | 438/592 |
| 6,660,664 B1 | 12/2003 | Adkisson et al. | | |
| 6,731,007 B1 * | 5/2004 | Saito et al. | ..................... | 257/762 |
| 6,750,079 B2 * | 6/2004 | Lowrey et al. | .................. | 438/95 |
| 6,887,784 B1 * | 5/2005 | Blosse | ........................... | 438/638 |
| 2006/0027878 A1 | 2/2006 | Chinthakindi et al. | | |

* cited by examiner

*Primary Examiner* — Chris Chu
(74) *Attorney, Agent, or Firm* — Blakely, Sokoloff, Taylor & Zafman LLP

(57) ABSTRACT

Methods of fabricating a first contact to a semiconductor device, which fundamentally comprises providing a semiconductor device formed on a substrate. The substrate further includes a conductive surface. A dielectric layer is formed over the substrate and has an opening exposing the conductive surface. The opening extends an entire length of the semiconductor device, partway down the entire length of the device, extending from the device onto adjacent field of the device, or and a combination thereof. A barrier layer is formed within the opening. A copper containing material fills the opening to form a first contact to the semiconductor device.

13 Claims, 11 Drawing Sheets

COPPER-FILLED TRENCH CONTACT FOR TRANSISTOR PERFORMANCE IMPROVEMENT

BACKGROUND

1. Field

Embodiments of the present invention relate to the fabrication of interconnect structures in microelectronic devices. In particular, embodiments of the present invention relate to utilizing copper to form contact immediately to device formed on a semiconductor substrate.

2. State of the Art

The fabrication of microelectronic devices involves forming electronic components on microelectronic substrates, such as silicon wafers. These electronic components may include transistors, resistors, capacitors, and the like, with intermediate and overlying metallization patterns at varying levels, separated by dielectric materials, which interconnect the electrical components to form integrated circuits. The metallization patterns are generally referred to as "interconnects."

One of the main issues confronting the semiconductor processing industry is that of the resistance problem in metallization layers. An industry-wide effort has undertaken to address the problem. Since the beginning, the semiconductor processing industry has relied on aluminum and aluminum alloys to serve as metallization layers. Silicon dioxide was selected as the insulator of choice although polyimide, a polymer, was used in a number of products by IBM for a number of years. With each succeeding generation of technology, the resistance problem grows. Because each generation requires that the dimensions of the semiconductor structure be reduced, the minimum line-space combination must also decrease. As the line-space combination decreases, the resistance of the semiconductor structure increases.

Copper metallurgy has been proposed as a substitute for aluminum metallurgy as a material for the metallization layers since copper exhibits greater conductivity than aluminum. Yet several problems have been encountered in the development of copper metallurgy. The main issue is the fast diffusion of copper through an insulator, such as silicon dioxide, to form an undesired copper oxide compound. Another issue is the known junction-poisoning effect of copper. These issues have led to the development of a liner to separate the copper metallization layer from the insulator.

Suitable liners include titanium nitride, tantalum nitride, tungsten silicon nitride, zirconium, hafnium, titanium, tantalum, and the like.

FIG. 1A illustrates a conventional semiconductor structure 100 (e.g., a transistor). The semiconductor structure 100 includes a substrate 102 having formed therein isolation regions (Shallow Junction Isolation, STI) 104. Active or passive devices can be formed on the substrate 102. Such devices typically include source and drain regions 106, gate dielectric 112, gate electrode 114, spacers 110 and silicide surfaces 108 and 116. As shown in FIG. 1B, to electrically connect to and from the device, contacts 120 (first contacts) are made to the device. Typically, several layers of interconnections are also made to connect to the first layer of contacts. An interlayer dielectric layer 118 is formed and patterned on the substrate 102. Through vias (or contact holes) are formed in the dielectric layer 118 to expose contact areas on the substrate. Contact areas typically are source/drain regions and/or on top of the gate electrode 114. To establish/enhance the contact connection, silicide layers 108 and 116 are formed on the surface of these regions as shown in FIGS. 1A-1B. The through vias are then filled with tungsten (referred to as tungsten plug) to form the first level of contact to the device. In some applications, an additionally contact 122 (or VIA0) formed in a dielectric layer 124 is also formed to connect the contact or tungsten plug 120. The additional contact (or VIA0) 122 can be filled with copper. Then, a plurality of metallization layer 130 having dielectric material 126 and conductive lines 128 are formed on top of the device.

Because of the undesirable characteristics of copper, copper has not been used in forming the first contact that is immediate to the device. However, as devices are scaled smaller and smaller, the high resistivity characteristic of the conductive material such as tungsten that is typically used in the first contact layer is becoming more undesirable. Tungsten causes parasitic resistance in the device by introducing high resistivity and low conductivity at the first contact level, at the junction from the first contact level to other interconnection levels in the devices. Thus, there is a need for a first layer of contact directly to the device that will lower resistivity overall.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIG. 3B-1 illustrates a three-dimensional view of a first contacts made to a source/drains region for a conventional device;

FIG. 3B-2 illustrates a three-dimensional view of a row of first contact pillars made to a source/drain region for a conventional device;

DETAILED DESCRIPTION OF THE ILLUSTRATED EMBODIMENT

Figure 1A:
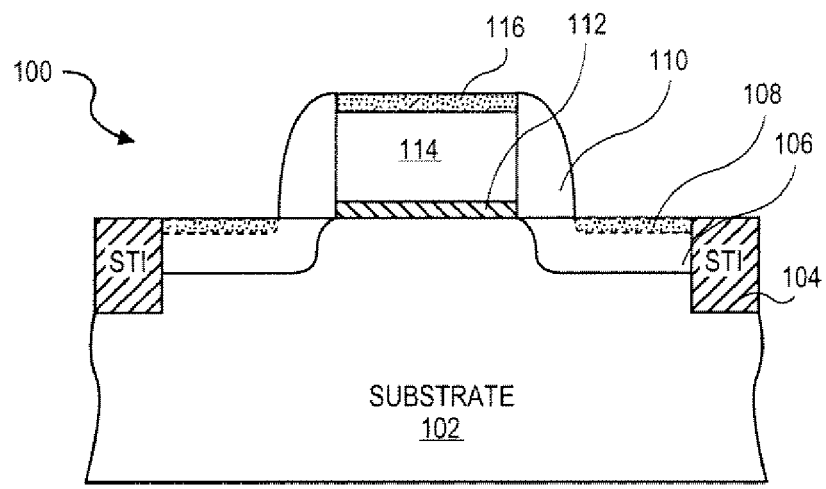
FIG. 1A-1B illustrates a conventional semiconductor device such as a transistor.
Figure 1B:
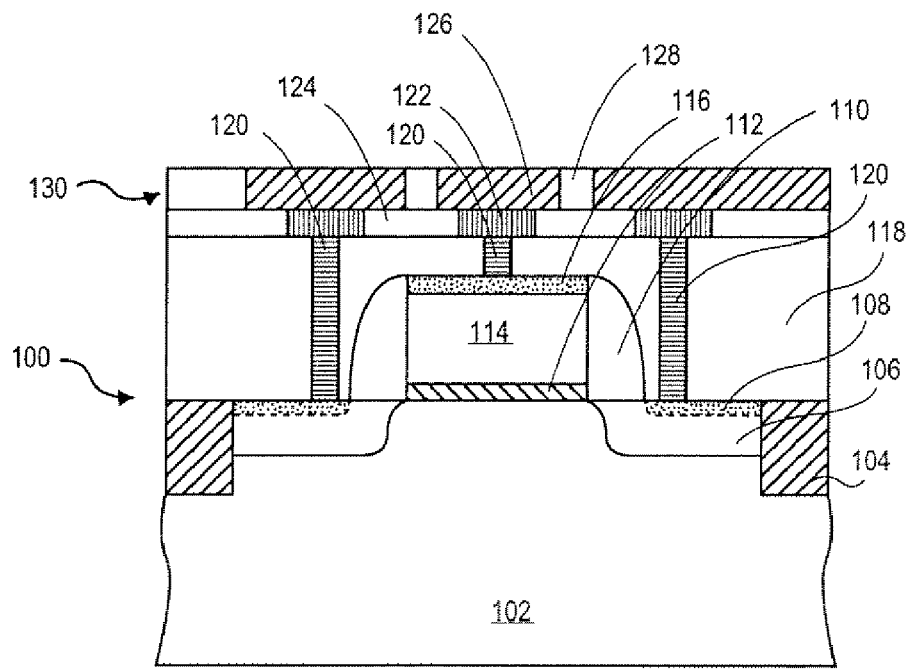

In the following detailed description, reference is made to the accompanying drawings that show, by way of illustration, specific embodiments in which the invention may be practiced. These embodiments are described in sufficient detail to enable those skilled in the art to practice the invention. Certain known processes are not described or discussed in details in order to not obscure the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Embodiments of the present invention relate to the fabrication of interconnect structures in microelectronic devices. More particularly, embodiments of the present invention disclose the use of copper (Cu) in the Front-End-Of-Line (FEOL) processing for a semiconductor device such as a transistor. As is known, a semiconductor device is typically formed buried in the semiconductor substrate. What end up being exposed are usually contact regions for interconnecting the devices to other metallization layers. Minimizing resistance from one interconnection level to the next is desired for an efficient and optimal device.

Currently, copper is not used in the FEOL processing due to the high tendency of copper to diffuse through an insulator even though copper has the desirable low resistivity and high conductivity characteristics. Copper can create copper oxide and disrupt the device. Copper can also migrate into the substrate, diffuse, and create both yield and reliability issues as it getters on dislocations or other interfaces. Because of such dangerous possibility, contacts immediately above the surface of the semiconductor substrate or the device have been formed with tungsten (W) to provide conductive interfaces or interconnection to the device while preventing the diffusion of copper into the device areas. Copper is used in many metal layers in the Back-End-Of-Line processing (e.g., dual damascene processing) to form metallization layers.

Fabrication of a semiconductor device includes two main process flows, FEOL and BEOL processes. In the FEOL process, wafer substrates are marked, STI regions are formed, e.g., by implantation, P- and N-wells are formed, e.g., by implantation, poly gate stacks are etched and formed, and source and drain regions are also formed by doping. Also, silicide layers or regions are also formed to enhance or establish conductive surfaces to the device. Also in the FEOL process, the first contact level is made to the device. The first contact levels typically include contacts to the source/drain regions and the gate electrode region (or the respective silicide surfaces). In the BEOL process, the device and the associated contacts are interconnected to metallization layers including forming the metallization and dielectric layers. Copper has been used in the BEOL process, e.g., dual damascene processing to form vias and trenches in the dielectric layers.

As mentioned, in conventional FEOL processing, tungsten is used for the first layer of contact. Embodiments of the present invention relate to forming the first layer of contact using copper. Additionally, the conventional FEOL processing has the first contacts being vertical thin lines (or pillars), referred to as "round contacts." Embodiments of the present invention include forming the first contacts with "extended interconnect-style contacts" or "trench contacts" that have rectangular/square configurations. In one embodiment, a first contact extends the entire length of the contact region. In one embodiment, the first contact extends the entire length of the contact region and replace a a set of conventional contact pillars. For example, the first contact to a source region would extend the entire length of the source region. In other embodiments, the contact would extend only partially down the length of the contact region.

Embodiments of the present invention also pertain to using barrier layers to encapsulate the first contact that is made of copper. Embodiments of the present invention also include forming a silicide layer that can also act as a barrier layer and in some embodiments, the silicide layer is a copper silicide layer. Embodiments of the present invention also reduce contact resistance from the first contact to the device, between the first contact and the silicide layer, and between the first contact and other metallization layer above the first contact.

Embodiments of the present invention may enable better density scaling and cross-technology scaling by enabling optimal placement and alignment flexibility in interconnection positioning. Additionally, with the trench contact configuration, one device can be connected to another without going up to another metallization layer as is currently done in the art. More importantly, the copper contacts provide reduction in parasitic resistance in the device by eliminating the conventional copper-to-tungsten junction and replacing it with copper-t-copper junction from the device to the metallization layers. The resistivity reduction in the contacts and interconnection also enable more conductivity, thus, better drive current in a device. Furthermore, the extended interconnect-style contact in the first contact level improves drive current by enhancing not just vertical conductivity but also lateral conductivity since the contact extend more laterally compared to a conventional round-type contact. Thus, the conductivity to and from the device is increased, and in many cases, an increase of 30-45% drive current have been observed with devices made in according to embodiments of the present invention.

Figure 2:
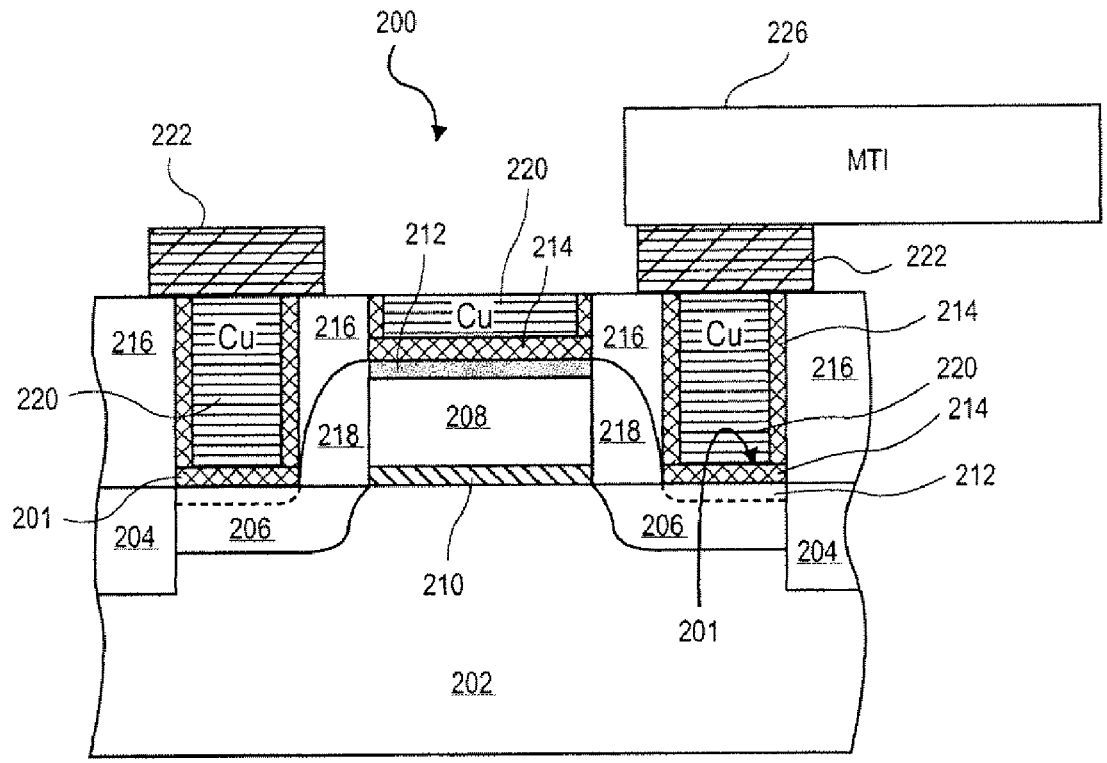
FIG. 2 illustrates an exemplary semiconductor device made according to embodiments of the present invention where a first contact to the device is formed with copper.

FIG. 2 illustrates an exemplary microstructure device 200 fabricated according to embodiments of the present invention. The device 200 can be a transistor or capacitor or other semiconductor device. The device 200 is formed on a semiconductor substrate 202 (e.g., a silicon wafer). Isolation regions such as STI 204 are formed in the substrate 202 to isolate one device from another as is known in the art. Source and drain regions 206 are also formed by doping into the substrate 202 as known in the art. Between the source and drain regions 206 and on the top surface of the substrate 202, a gate dielectric 210 is formed. A gate electrode 208 is formed on top of the gate dielectric 210. Contacts to the device 200 can be made to the source and drain regions 206 and optionally, the gate electrode 208. The source/drain regions or gate electrode can sometimes be referred to as conductive surfaces so that the first contact can be made to the device 200. Often, a layer of silicide material 212 is formed over the source and drain regions 206 and optionally, the gate electrode 208 to enhance the contact. The silicide layer 212 can be formed as conventionally done. When silicide layer 212 is include, the contact surfaces are the silicide surfaces. Spacer sidewalls 218 are also disposed on each side of the gate electrode 208.

Contacts are made to the device. As referred herein, the first layer of contact refers to the contact that is made immediate to the device 200 or on the top surface of the substrate 202 or as illustrated in FIG. 2 (on top of the silicide layer 212). Thus, contacts are made to the source/drain regions 206 and the gate electrode 208 (or their respective silicide layer formed thereon). In one embodiment, a dielectric layer 216 is formed on the top surface of the substrate 202. Openings 201 are formed into the dielectric layer 216 and expose the silicide layer 212. In one embodiment, the silicide layer 212 lines the bottom of each opening 201. In one embodiment, a barrier layer 214 lines the entire surface (bottom surface and sidewalls) of the opening 201 as shown in FIG. 2. The openings 201 are then filled with copper to form the first contact 220 using methods such as deposition, sputtering, electroplating, or electroless plating. In one embodiment, a seed layer (not shown) is also used to line the opening and on top of the barrier layer 214 to promote the adhesion of the copper or to promote nucleation of copper to form the first contact 220. In one embodiment, a via connector 222 is formed that connects to the first contact 220. In one embodiment, the via connector 222 and the opening 201 are filled in a single operation. The via connector 222 is then interconnected to one or more metallization layers (MT1 to MT8) 226 above. Methods such as dual damascene processing can be used to form the via connector 222 and the metallization layers MT1-MT8. Inter-level dielectric layers are also used at each metallization layer as is known in the art.

In more particular, the terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure and layer formed above, and the terms wafer or substrate include the underlying layers containing such regions/junctions and layers that may have been formed above. The following detailed description is, therefore, not to be taken in a limiting sense, and the scope of the present invention is defined only by the appended claims.

The silicide layer 212 can be formed using a conventional method such as depositing a conductive material (e.g., using chemical vapor deposition) on the top surface of the source/drain regions 206 or the gate electrode 208 and then anneal the structure to form the silicide material. In one embodiment, the silicide layer 212 comprises any metal that is capable of reacting with silicon to form metal silicide. Examples of such metals include Ti, Ta, W, Co, Ni, Pt, Pd and alloys thereof. The silicide layer 212 may be deposited using a conventional deposition process including chemical vapor deposition, physical vapor deposition, sputtering, evaporation, chemical solution deposition, plating, and the like. To complete the silicide layer formation, the structure is annealed to convert the silicide metal layer 212 into a metal silicide. The annealing is typically done at a temperature from about 600-3000° C. An inert gas (e.g., helium, argon, and nitrogen) may be presence during the silicide annealing.

The dielectric layer 216 includes a substance that comprises a material selected from a group consisting of a polymer, a foamed polymer, a fluorinated polymer, a fluorinated-foamed polymer, an aerogel, and an insulator oxide compound. The polymer includes polyimide. The insulator oxide compound may include silicon dioxide, silicon nitride, carbon doped oxide, fluorinated silicon oxide, boron/phosphorous doped oxide, and the like. The dielectric layer 216 can be formed using a conventional method such as chemical vapor deposition, evaporation, atomic layer deposition, or chemical solution deposition.

Vias 201 may be formed into the dielectric layer 216 using methods known in the art, e.g., etching, photolithography, lithography, ion milling, laser ablation, damascene, dual damascene, and the like. The vias 201 are opening formed in the dielectric layer 216 and extending into the dielectric layer. In one embodiment, the vias 201 have a trench-like configuration or an extended interconnect-style configuration as opposed to the conventional thin vertical line via.

The barrier layer 214 is formed to prevent diffusion of the copper atoms into the dielectric layer 216. This diffusion changes the microstructure of a portion of the device 200 and causes undesired effects. The barrier layer 214 can be formed using conventional methods. The barrier layer 214 can be thin and in one embodiment, less than 100 Å. In other embodiments, barrier layer 214 is less than 20 Å, less than 15 Å, and even less than 10 Å along the sidewalls of the opening 201 and optionally, along all surfaces of the opening 201. In one embodiment, the barrier layer 214 is made of a material that can both act as a diffusion barrier for the interconnect material (such as acting as a diffusion barrier for copper and copper alloys) and act as an activation/nucleation layer for the interconnect material to form thereon (such as acting as a seed layer for the copper to form).

Materials that can be used as a barrier layer include but are not limited to ruthenium (Ru), paladium (Pd), rhodium (Rh), nickel (Ni), cobalt (Co), and platinum (Pt), titanium (Ti), tantalum (Ta), titanium nitride (TiN), TaN, WsiN, Zr, hafnium (Hf), tungsten (W), etc. A portion of the barrier layer 214 may also extend over and abut the surface of dielectric layer 216.

In one embodiment, a seed layer (not shown) is deposited on the barrier layer 214 prior to the deposition of the copper to form the first contact 220. A low-energy ion implantation can be used to form the seed layer. In one embodiment, depositing the seed layer includes depositing a copper seed layer. In one embodiment, depositing the seed layer includes depositing copper seed layer having a thickness of less than 100 Angstroms. This can be achieved using an $8 \times 10^{16}$ ion implantation of copper. In one embodiment, the energy of implantation includes about 100 electron-volts. Additionally, the copper seed layer can also be implanted at an angle normal to the planarized surface.

The seed material may be deposited in a chemical vapor deposition (CVD) process, an atomic layer deposition (ALD) process or a physical vapor deposition (PVD) process, such as magnetron sputtering, but is not so limited. The seed material provides a nucleation site for a subsequent electroless plating process for the copper. The seed material may include, but is not limited to, copper (Cu), palladium (Pd), cobalt (Co), nickel (Ni), ruthenium (Ru), platinum (Pt), alloys thereof, and the like.

In one embodiment, copper is electrolessly deposited into the via 201 to form the first contact 220. The electroless deposition process may include any autocatalytic (e.g., no external power supply is applied) deposition of the conductive material layer through the interaction of a metal salt and a chemical reducing agent. As is known in the art, preparing or treating a surface, may be necessary in order to produce an activated surface so that the surface that is receptive to the electroless deposition process.

In one embodiment, during the electroless deposition, the seed material serves as the activated surface upon which the electroless deposition forms. The seed material also acts as a region which controls the placement of the deposited copper from the electroless deposition solution only deposits on the prepared or treated surface (e.g., the seed material).

In one embodiment, the electroless plating bath or deposition solution may comprise cobalt and alloys thereof (such as cobalt alloyed with tungsten, boron, phosphorus, molybdenum, and/or the like), nickel and alloys thereof (such as nickel alloyed with tungsten, boron, phosphorus, molybdenum, and/or the like), copper, palladium, silver, gold, platinum metals and their selective alloys to fill narrow and high aspect ratio trenches and via holes. It is, of course, understood that the electroless deposition solution may also include additives (such as suppressors, polyethylene glycol, and anti-suppressors, di-sulfide) and complexing agents (such as thiosulfate and peroxodisulfate). Although a few examples of materials that may comprise the electroless deposition solution are described here, the solution may comprise other materials that serve to deposit the conductive material electrolessly. The technique of electrolessly depositing a metal or metal alloy is known to those skilled in the art, and may be performed either by immersing the substrate in an electroless deposition solution, by semi-immersion, or by spraying the electroless deposition solution onto the substrate or target (e.g., the dielectric material layer 216). It is well known to those skilled in the art that the seed material may be subsumed during the electroless deposition process, such that the seed material may become continuous with the conductive material.

In one embodiment, the contact 220 is planarized after the copper fills the vias 201, usually by a technique called chemical mechanical polish (CMP) or by an etching process, which removes the copper, which is not within the opening 201.

In one embodiment, via connector 222 are formed to electrically interconnect to the first contact 220. A conventional BEOL process can be used to form the via connector 222. For example, a dual damascene method can be used to form the via connector 222. The via connector 222 connects to the metallization layers 226, which can also be formed using similar methods. In an alternative embodiment, the copper deposited in the opening to form the first contact 220 is etched or otherwise removed in a way to leave the via connector 222 extending from the first contact 220. In one embodiment, the first contact 220 and the via connector 222 are filled simultaneously with copper. It is to be noted that dual damascene process is not the only technique that can be used to form the first contact 220 and the via connector 222. Conventional metal etching methods can be used to form the first contact 220 and the via connector 222, sequentially or simultaneously.

Figure 3C:
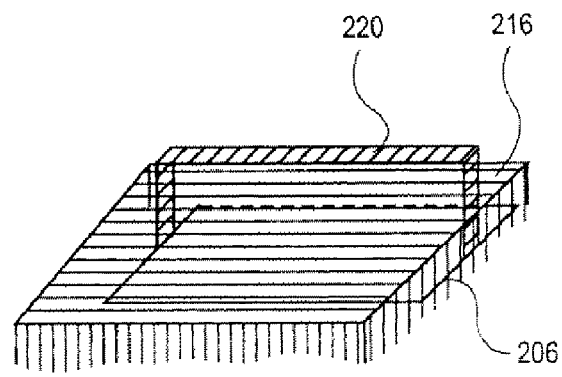
FIG. 3C illustrates a three-dimensional view of a first contacts made to a source/drains region for a device according to embodiments of the present invention.
Figures 1, 3A:
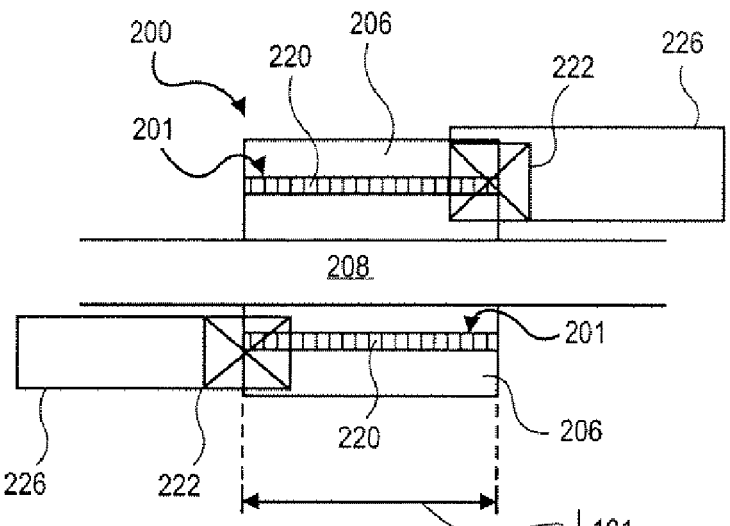
FIGS. 3A-1-3A-3 illustrates a top view of a first contacts made to source/drains regions for the device shown in FIG. 2.
Figures 2, 3A:
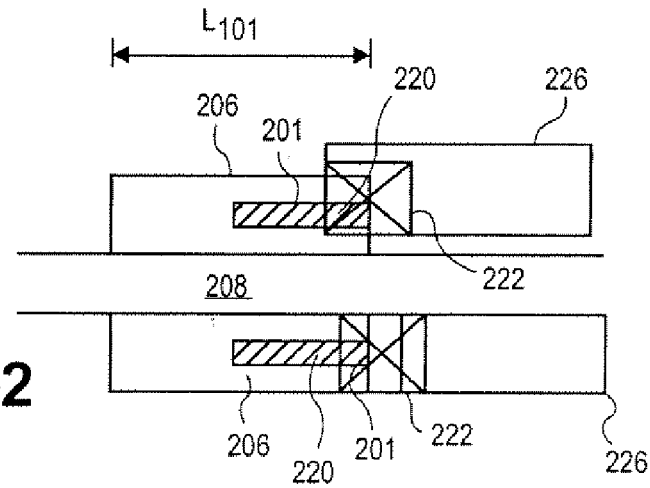
Figures 3, 3A:
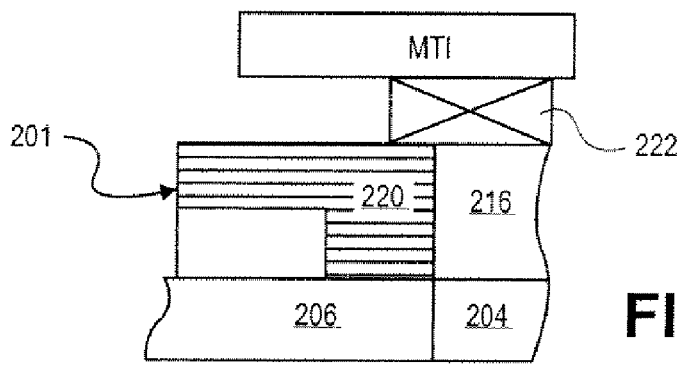
Figures 2, 3B:
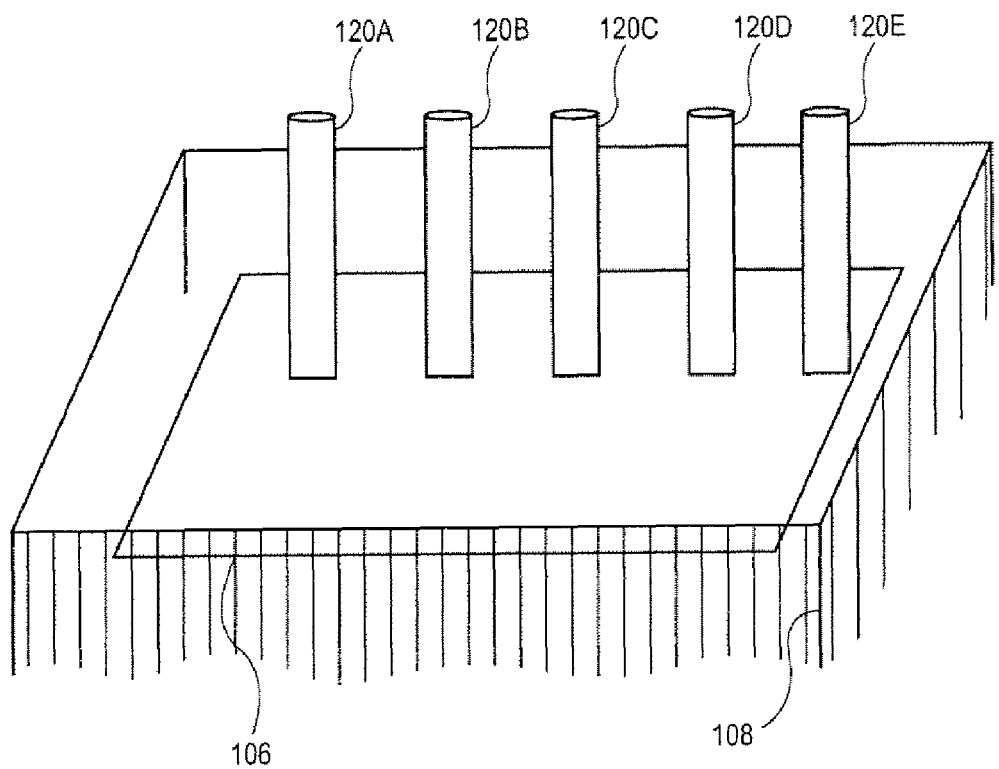
Figures 1, 3B:
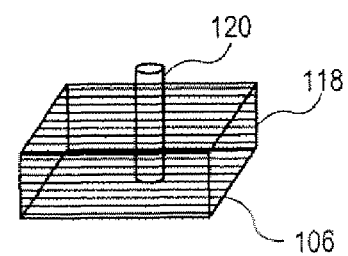

FIGS. 3A-1 to 3A-3 describe in more details an exemplary embodiment where the first contact has a configuration of an extended interconnect-style contact as opposed to the conventional round via or line of vias (in other words, a conventional vertical pillar; or line of pillars) contact shown in FIG. 3B-1 and FIG. 3B-2. In the present embodiment (FIG. 3A-1), the first contact 220 extends an entire length of the source and drain regions 206. Similarly, the first contact 220 that is formed over the gate electrode 208 may also extend the entire length of the gate electrode 208. It is to be understood that in many devices, the first contact 220 does not extend the entire length of the source and drain regions or that the first contact 220 extends a length sufficient to allow electrical interconnection to the device (FIG. 3A-2). In one embodiment, the first contact 220 has a rectangular configuration as shown in FIGS. 3A-1 to 3A-3.

FIG. 3A-1 illustrates the device 200 from a top view with the source and drain regions 206 and the gate electrode 208 showing. The silicide layer 212 is not shown for clarity purpose. In one embodiment, the opening 201 is formed so that the opening 201 extend an entire length L101 of the source/drain regions 206. In one embodiment, the opening 201 extends an entire length of the device. In other embodiments, the opening 201 extends down a fraction of the device as shown in FIG. 3A-2. In yet other embodiments, the opening 201 extends a fraction of the device and then extend larger to meet the via connector 222 as shown in FIG. 3A-3. While FIGS. 3A-1 and 3A-2 show the top view of the device FIG. 3A-3 shows the cross-sectional side view for clarity purposes.

The via connector 222 needs not be placed entirely over the first contact 220. As shown in FIGS. 3A-1 and 3A-2, the via connector 222 is placed partially in contact with and only partially over the first contact 220. Similarly, the first metallization layer MT1 226 needs not be placed entirely over the first contact 220 or the via connector 222. As shown in FIG. 3A-1, the metallization layer MT1 226 is placed partially in contact with and only partially over the via connector 222 and/or the first contact 220.

FIG. 3B-1 illustrates the configuration of a conventional via contact (e.g., device 100). Here, a source/drain region 106 and a dielectric layer 118 formed over the source/drain region are shown. The via has a configuration of a cylindrical tube (or pillar) and as such, often is called "round contact." The conventional via is typically only a thin vertical conductive line forming through the dielectric layer and connecting to the contact region (e.g., source/drain region) as shown in FIG. 3B-1. The conventional via can be implemented as a single pillar (as in FIG. 3B-1) or a line of pillars (as in FIG. 3B-2) On the other hand, in one embodiment, the first contact 220 made according to embodiments of the present invention has the configuration of a rectangular contact or trench contact as shown in FIG. 3C (in a three dimensional view).

The extended configuration or trench contact configuration for the first contact 220 enables flexibility in circuit design and placement of the interconnecting elements. For example, the trench contact need not run the entire length of the source drain region, and (because of the high conductivity of the contact due the the Cu fill) can also extend significantly beyond the edge of the source drain region. The via connector 222 needs not be placed directly over the region of the substrate 202 where the device is formed ("field region") but instead, can be placed toward the side where space is available and still able to interconnect to the first contact 220. Additionally, filling the trench contact with copper may be easier than filling a round via contact with copper. Furthermore, the extended first contact filled with copper reduces vertical resistivity as well as lateral resistivity; and, being filled with copper, the first contact further optimizes drive current by providing optimal vertical and lateral conductivity. In one embodiment, a device built using the extended-interconnect style first contact has a 10-15% conductivity improvement over the conventional round style first contact.

Figure 4A:
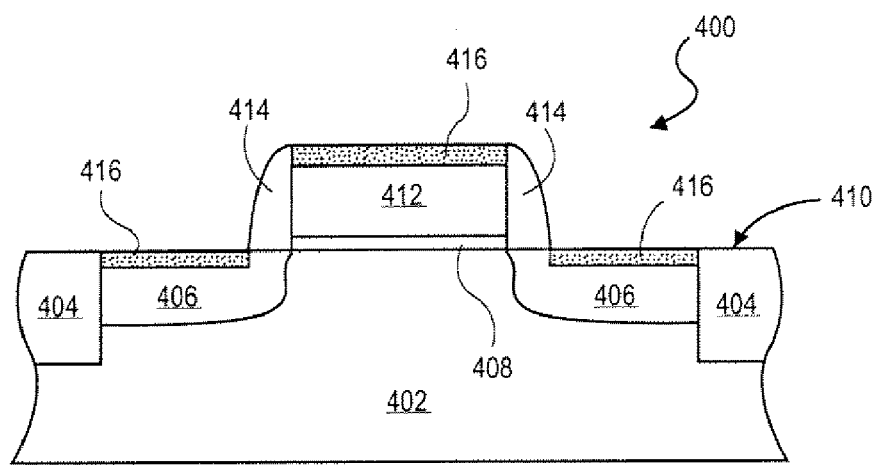
FIGS. 4A-4C illustrate an exemplary process flow of making a semiconductor device made according to embodiments of the present invention where a first contact to the device is formed with copper.
Figure 4B:
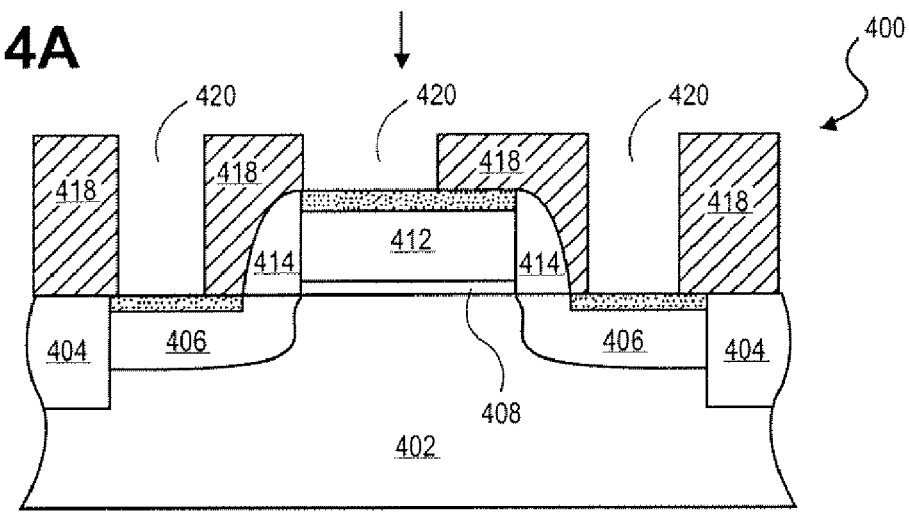
Figure 4C:
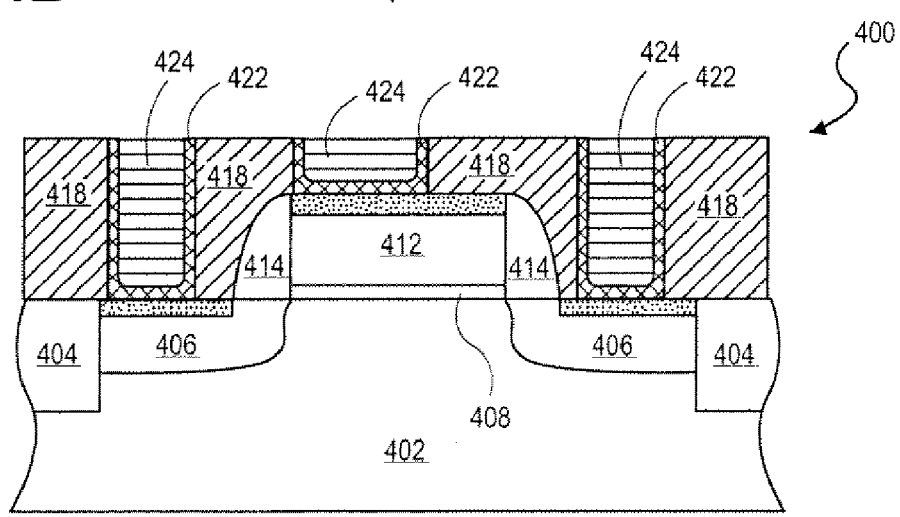

FIGS. 4A-4C illustrate an exemplary process flow and corresponding structures throughout the process of making a semiconductor device 400 during a FEOL according to embodiments of the present invention. A substrate 402 is provided. The substrate 402 has a set of isolation regions 404 formed therein. Source and drain regions 406 are also formed in the substrate. A gate dielectric 408 is formed on the top surface 410 of the substrate 402. A gate electrode 412 is formed on top of the gate dielectric layer 408. Typically, the gate electrode 412 and the gate dielectric are referred to as a gate stack. Spacers 414 are also formed on each side of the gate stack.

In one embodiment, (FIGS. 4A-4B), a silicide layer is formed over the contact regions of the device and in the present example, a silicide layer 416 is formed over the source/drain regions 406 and the gate electrode 412. In one embodiment, to form the silicide layer 416, a conductive metal is deposited and the structure is annealed to convert the metal and the top portion of the substrate into metal silicide. The silicide layer 416 is resistant to etching, is conductive, and behaves like a semiconductor crystal. The silicide layer 416 thus provides a conductive surface on a silicon surface. A dielectric layer 418 is formed over the surface 410 and patterned to form opening 420 as shown in FIG. 4B. In one embodiment, the opening 420 each extend the entire length of the device 400. Alternatively, the opening 420 only extends down part of the device. In either the case of a full extension or a partial extension, the opening may extend beyond the device over the adjacent field. For example, the opening 420 extends into the page and covers the entire length of the device 400 that extends into the page. An etch stop layer (not shown) may be used to prevent etching or damaging to the silicide layer 416 during the opening 420 formation process.

Alternatively, the dielectric layer 418 is formed over the substrate 402 (over the top surface 410) prior to the silicide layer 416 formation. The dielectric layer 418 is then etched to form the opening 420. Then, the silicide layer 416 is formed inside each of the opening 420.

In FIG. 4C, a barrier layer 422 is formed and lined the opening 420. In one embodiment, the barrier layer 422 (e.g., TaN) is formed in conjunction with an oxygen plasma treatment applied to the barrier layer 422 to improve its barrier performance.

Copper is then deposited into the opening 420 to form the first contact 424. In one embodiment a seed layer is not used. In such embodiment, the barrier layer 422 is made of a material that is capable of being activated to be a nucleated site for the copper to form thereon. In one embodiment, electroless plating is used to deposit the copper. In another embodiment, electroplating is used to deposit the copper. When the device 400 is completed, at this point, the FEOL may be considered finished and the BEOL begins to form other interconnection layers to the device 400. For example, via connectors and metallization layers are formed to connect to the first contact 424 using methods known in the art.

Figure 5A:
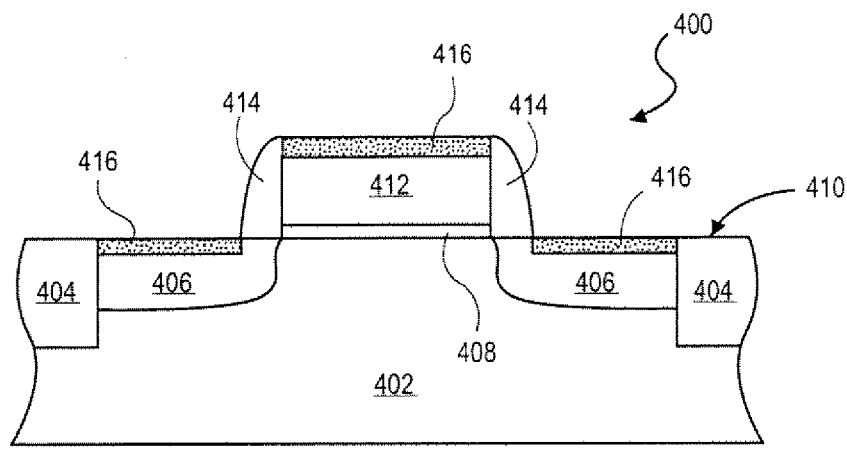
FIGS. 5A-5C illustrate another exemplary process flow of making a semiconductor device made according to embodiments of the present invention where a first contact to the device is formed with copper.
Figure 5B:
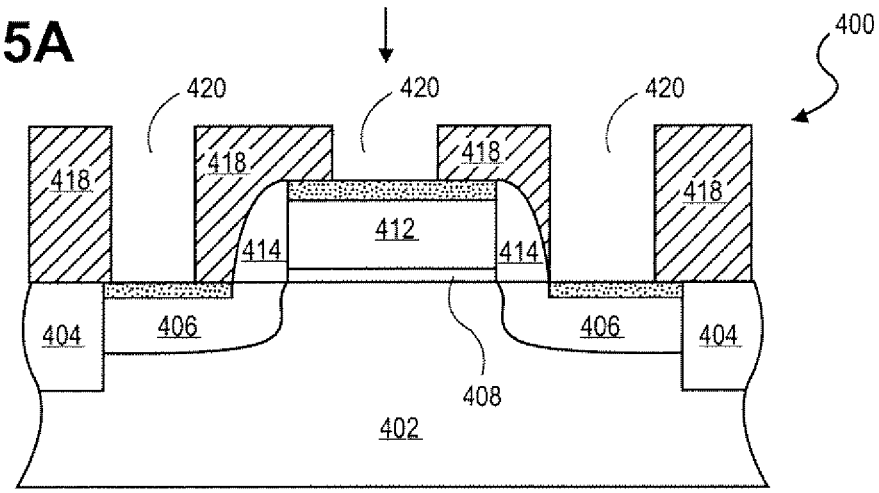
Figure 5C:
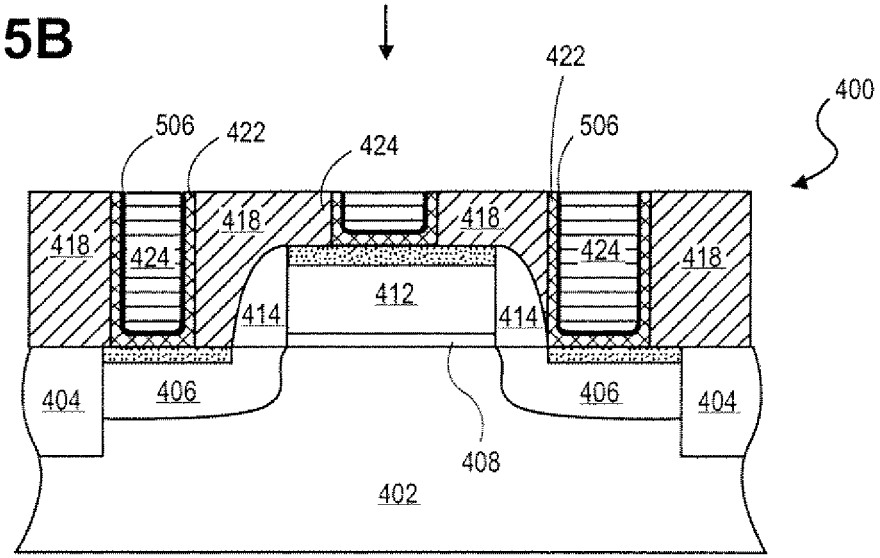

FIGS. 5A-5C illustrate an exemplary process flow similar to FIGS. 4A-4C with the addition of a seed layer 506 (e.g., a copper seed layer) being deposited on top of the barrier layer 422.

FIGS. 6A-6E illustrate another exemplary process flow of making a semiconductor device 600 during a FEOL according to embodiments of the present invention. A substrate 602 is provided. The substrate 602 has a set of isolation regions 604 formed therein. Source and drain regions 606 are also formed in the substrate. A gate dielectric 608 is formed on the top surface 610 of the substrate 602. A gate electrode 612 is formed on top of the gate dielectric layer 608. Typically, the gate electrode 612 and the gate dielectric 608 are referred to as a gate stack. Spacers 614 are also formed on each side of the gate stack.

In one embodiment, (FIGS. 6A-6B), a dielectric layer 618 is formed over the substrate 602 (over the top surface 610). At this point, unlike the device 400, no silicide layer is formed. The dielectric layer 618 is then etched to form the opening 620. In one embodiment, the opening 620 each extend the entire length of the device 600. Alternatively, the opening 620 only extends down part of the device. In either the case of a full extension or partial extension, the opening may extend beyond the device over the adjacent field. For example, the opening 620 extends into the page and covers the entire length of the device 600 that extends into the page.

Figure 6A:
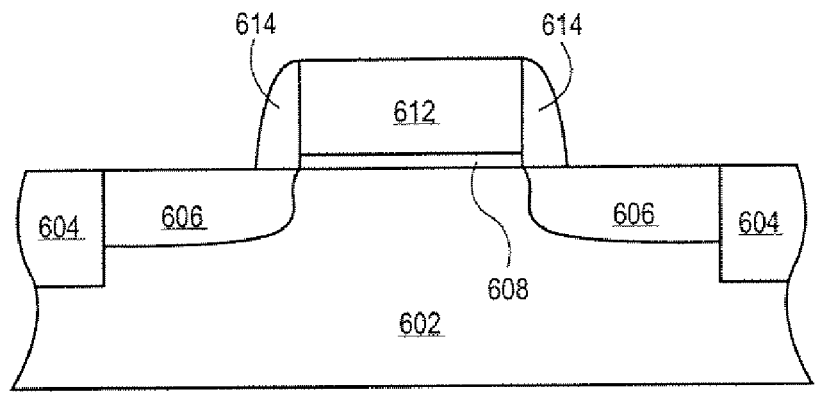
FIGS. 6A-6E illustrate yet another exemplary process flow of making a semiconductor device made according to embodiments of the present invention where a first contact to the device is formed with copper and where there is no prior silicide.
Figure 6B:
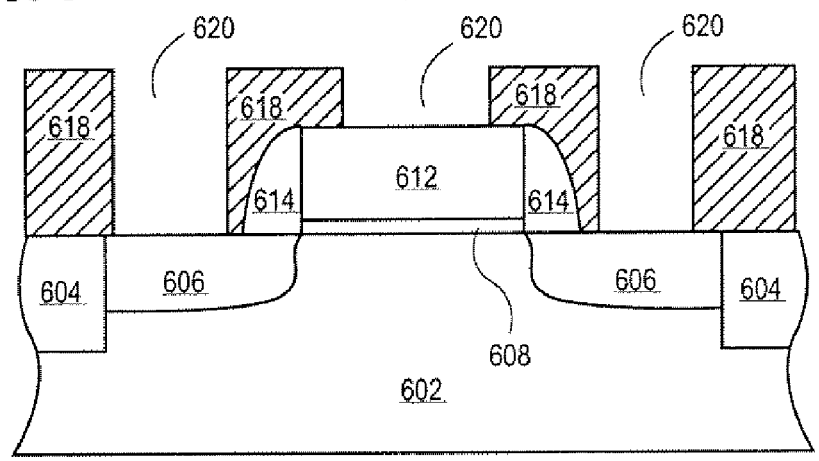
Figure 6C:
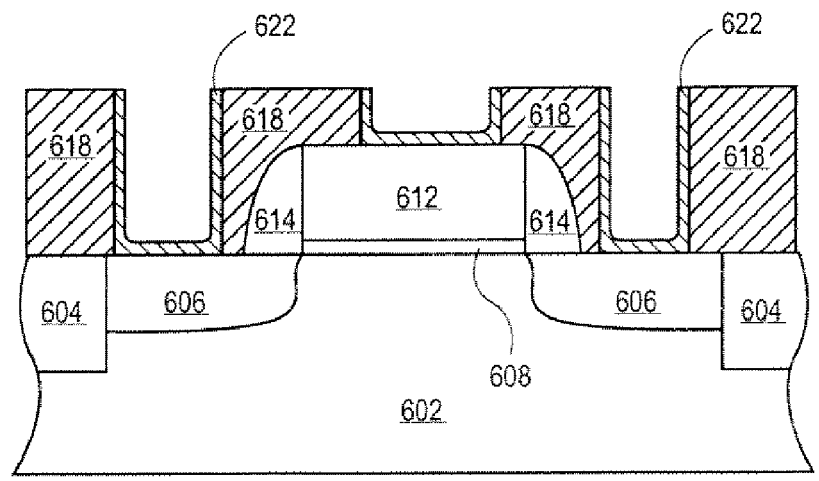
Figure 6D:
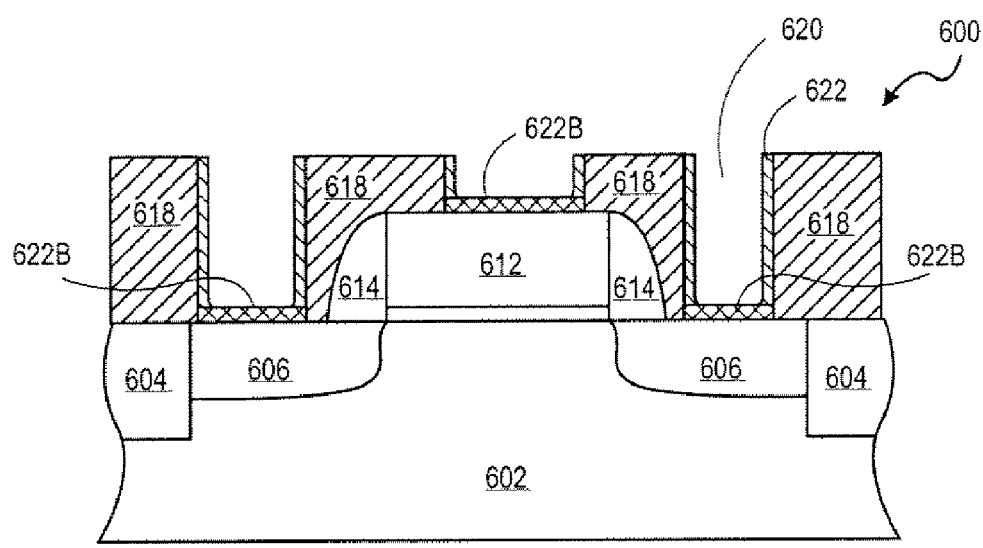

FIG. 6C, a barrier layer 622 is formed and lined the opening 620. In one embodiment, the barrier layer 622 is also formed to provide an additional function much like that of a metal silicide layer. The barrier layer 622 thus contains a metal or a conductive material that will react with the silicon surface and form a conductive surface similar to a conventional metal silicide. Further, the barrier layer 622 is made of material that inhibits diffusion of the copper into the dielectric layer 618. Examples of such metal include TaN, TaN(O), WN, tantalum, cobalt, nickel, and copper. In one embodiment, the barrier layer 622 (e.g., TaN or WN) is formed in conjunction with an oxygen plasma treatment applied to the barrier layer 622 to improve its barrier performance. The barrier layer 622 is also subjected to annealing so that the metal component in the barrier layer 622 can form metal silicide. It is to be noted herein that only the portion of the barrier layer 622 that lies above the source/drain region or on top of a silicon containing surface such as the source and drain region that a silicide layer is formed. Specifically, a portion of the barrier layer 622 is converted into silicide where the barrier layer 622 material is formed over the silicon. In one embodiment, copper is deposited and immediately annealed to form copper silicide which then allow the copper silicide to act as a barrier layer 622 with conductivity characteristic that of a metal silicide. FIG. 6D illustrates the bottom portion 622-B of the barrier layer 622 converting into a silicide portion after the barrier layer 622 is treated. The barrier layer 622 thus has a portion 622-B that transforms into a silicide layer in addition to the rest of the barrier layer 622 being a diffusion barrier for copper.

Figure 6E:
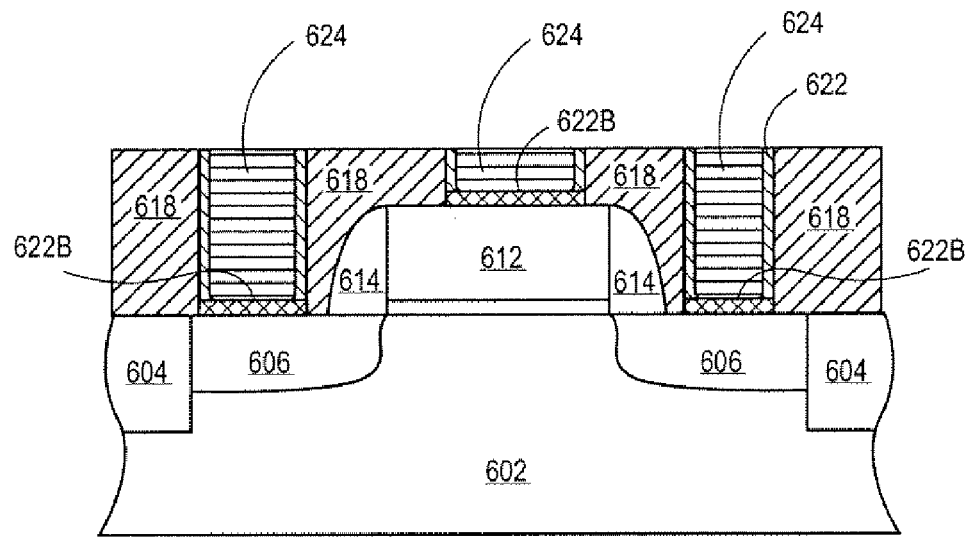

FIG. 6E shows copper being deposited into the opening 620 to form the first contact 624. In one embodiment a seed layer is not used. In such embodiment, the barrier layer 622 is also made of a material that is capable of being activated to be a nucleated site for the copper to form thereon. In one embodiment, electroless plating is used to deposit the copper. In another embodiment, electroplating is used to deposit the copper. When the device 600 is completed, at this point, the FEOL may be considered finished and the BEOL begins to form other interconnection layers to the device 600. For example, via connector and metallization layers are formed to connect to the first contact 624 using methods known in the art. In an alternative embodiment, a copper seed layer is deposited on top of the barrier layer 622 prior to the deposition of the copper through electroplating or electroless plating.

Figure 7:
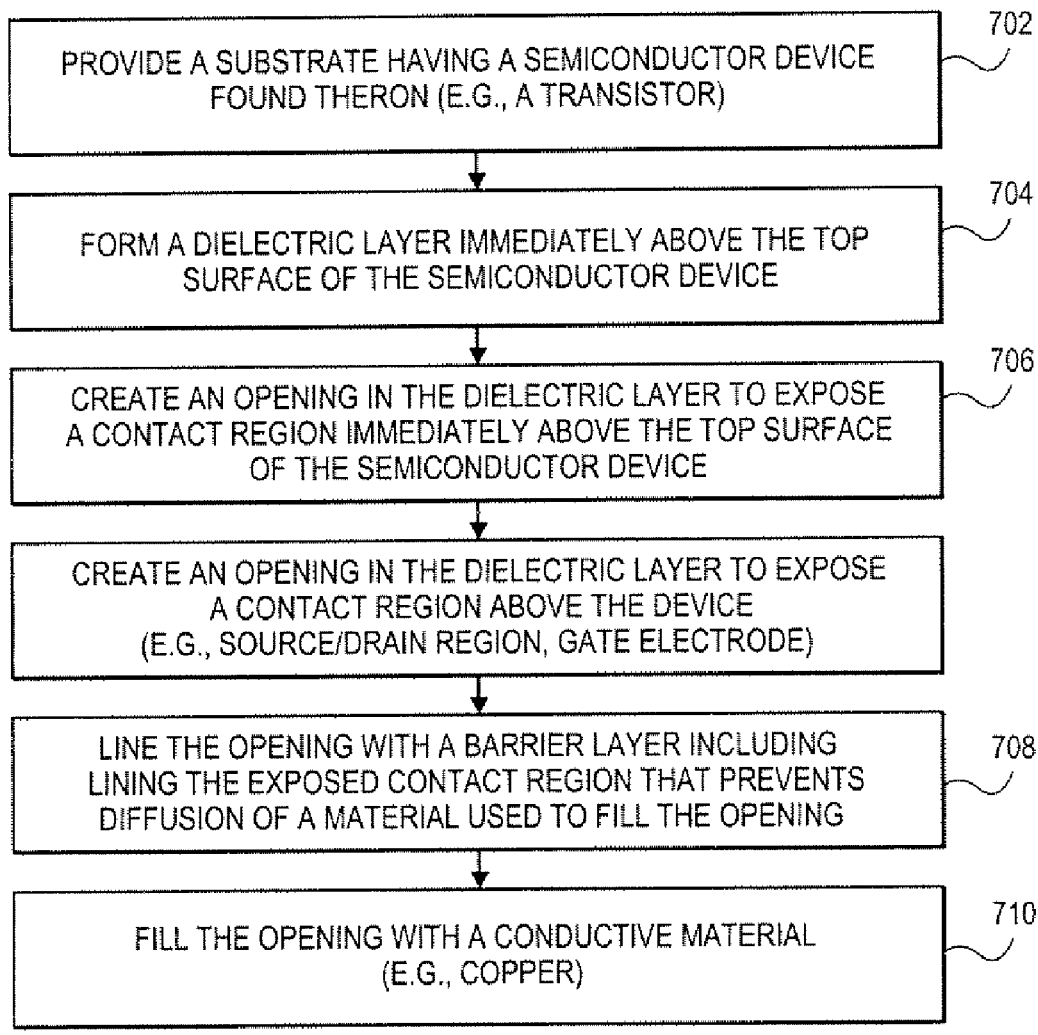
FIGS. 7-9 illustrate exemplary methods of making a semiconductor device made according to embodiments of the present invention where a first contact to the device is formed with copper with FIG. 7 illustrating a method where no silicide is used, FIG. 8 illustrating a method with silicide being used and FIG. 9 with silicide being forming through a contact opening.

FIG. 7 illustrates an exemplary method 700 of forming a contact to a semiconductor device (e.g., during a FEOL process). At 702, a substrate having a contact device (e.g., a transistor) formed thereon is provided. At 704, a dielectric layer is formed immediately above the top surface of the semiconductor device. At 706, an opening (having a trench like configuration or a rectangular configuration) is formed into the dielectric layer to expose a contact region (e.g., source/drain region) immediately above the top surface of the semiconductor device. The openings can extend the entire length of the device, for example, the openings exposing the source/drain regions extend the entire length of the source/drain regions. Alternatively, the opening only extends down part of the device. In either the case of a full extension or a partial extension, the opening may extend beyond the device over the adjacent field. At 708, the opening is lined with a barrier layer such that the barrier liner covers the exposed contact region to prevent diffusion of a material such as copper that will be used to fill the opening. At 710, the opening is filled with the conductive material or copper.

Figure 8:
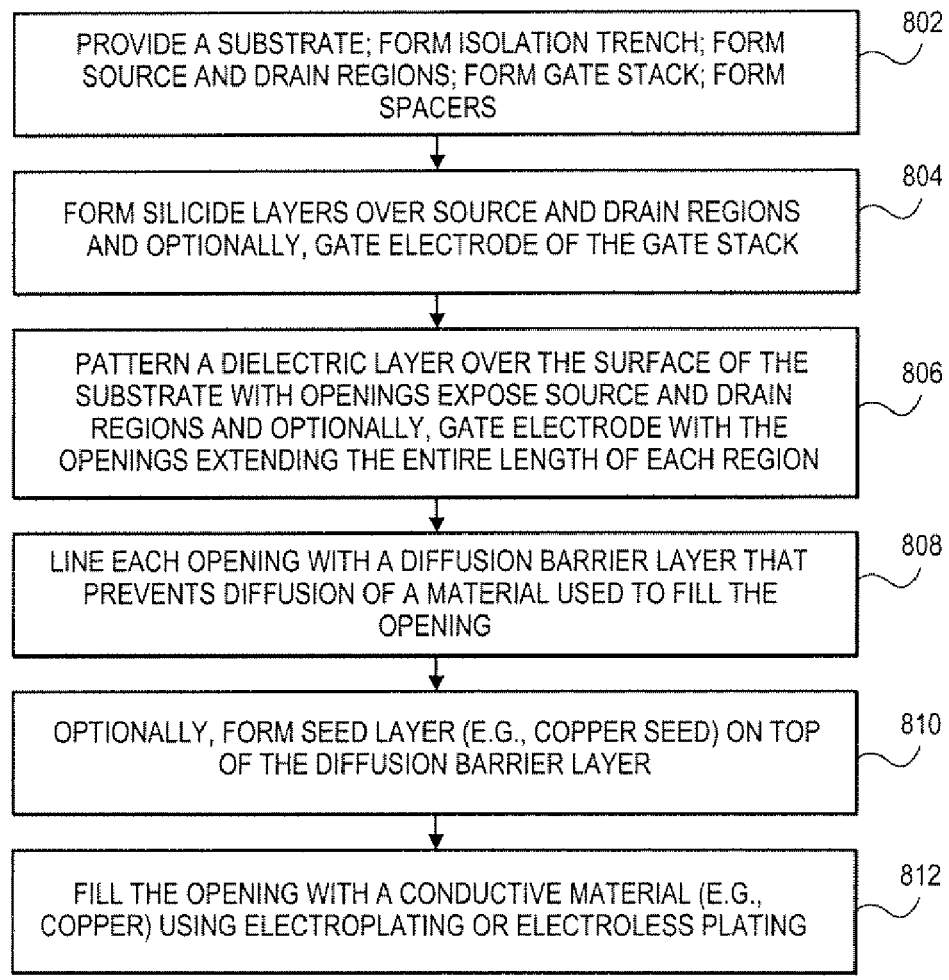

FIG. 8 illustrates an exemplary method 800 of forming a first contact to a semiconductor device (e.g., during a FEOL process). At 802, a substrate is provided. Isolation trench, source/drain regions, gate stack and spacers are also formed in or on the substrate. At 804, a silicide layer is formed over the source/drain regions and optionally, the gate electrode layer of the gate stack. At 806, a dielectric layer is formed immediately above the top surface of the semiconductor device. Openings (having a trench like configuration or a rectangular configuration) are formed into the dielectric layer to expose the source/drain regions and optionally, the gate electrode region. The openings can extend the entire length of the device, for example, the openings exposing the source/drain regions extend the entire length of the source/drain regions. Alternatively, the opening only extends down part of the device. In either the case of a full extension or a partial extension, the opening may extend beyond the device over the adjacent field. At 808, the opening is lined with a barrier layer such that the barrier liner covers the exposed contact region to prevent diffusion of a material such as copper that will be used to fill the opening. At 810, a seed layer is optionally formed on top of the barrier layer to initiate nucleation for the formation of the copper in the openings. At 812, the openings are filled with the conductive material or copper using electroplating or electroless plating.

Figure 9:
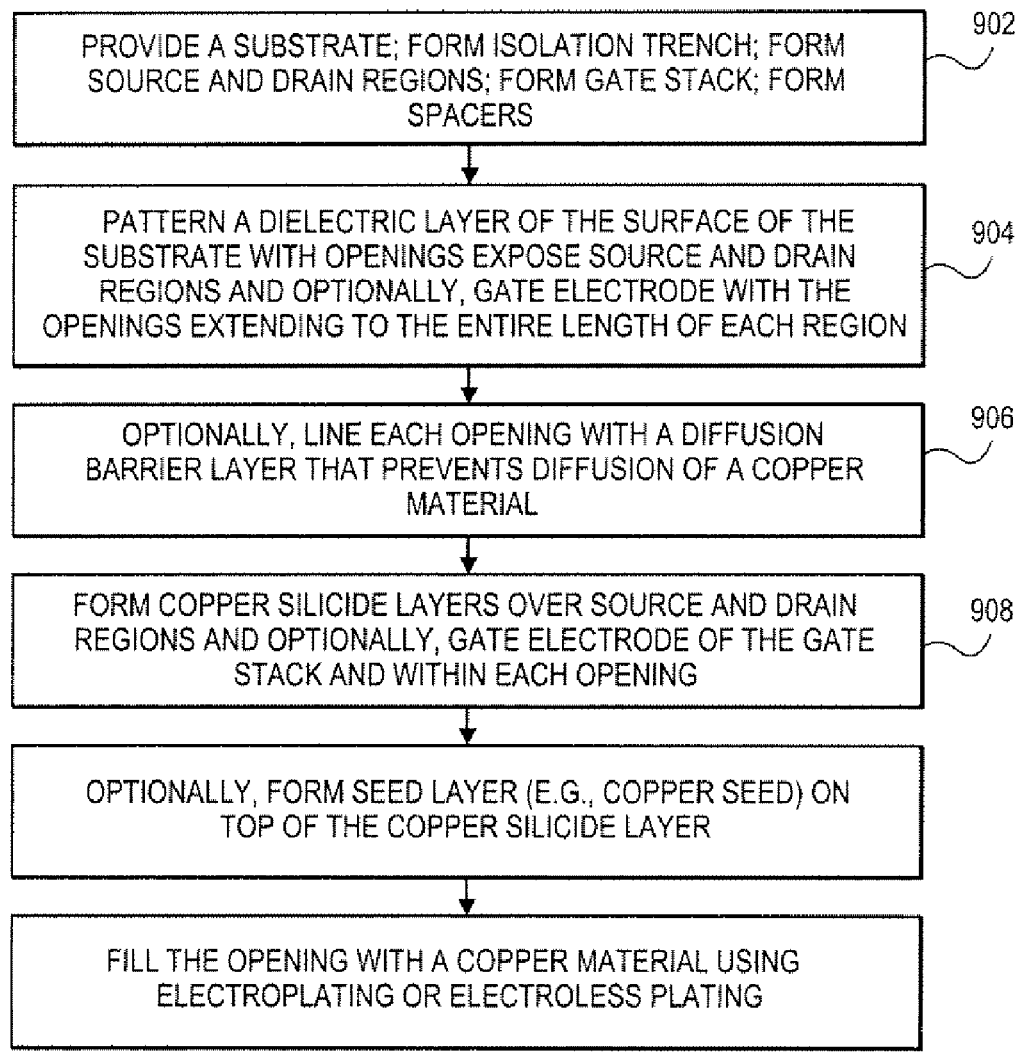

FIG. 9 illustrates an exemplary method 900 of forming a first contact to a semiconductor device (e.g., during a FEOL process). At 902, a substrate is provided. Isolation trench, source/drain regions, gate stack and spacers are also formed in or on the substrate. At 904, a dielectric layer is formed immediately above the top surface of the semiconductor device. Openings (having a trench like configuration or a rectangular configuration) are formed into the dielectric layer to expose the source/drain regions and optionally, the gate electrode region. The openings can extend the entire length of the device, for example, the openings exposing the source/drain regions extend the entire length of the source/drain regions. Alternatively, the opening only extends down part of the device. In either the case of a full extension or a partial extension, the opening may extend beyond the device over the adjacent field. At 906, a metal is added to permit formation of a silicide on the exposed silicon region. Using processing known in the art, the metal is annealed and a silicide layer is formed over the source/drain regions and optionally, the gate electrode layer of the gate stack. The opening is optionally lined with a barrier layer such that the barrier liner covers the exposed contact region to prevent diffusion of a material such as copper that will be used to fill the opening. At 910, a seed layer is optionally formed on top of the copper silicide layer to initiate nucleation for the formation of the copper in the openings. At 912, the openings are filled with the conductive material or copper using electroplating or electroless plating.

Embodiments of the present invention permit more flexibility in the placement of via connector and/or metalizations to a device while providing superior performance over conventional configuration of interconnection to a device. For instance, in one embodiment, (as the state of the art or conventional devices with round contacts does not even permit this configuration) a via connector such as the via connector 222 is located adjacent to the device on the adjacent field and connects to the device through the extension of a first contact such as the contact 220 onto the field. In this configuration the high conductivity of the trench contact style for the first contact provides significant performance improvement. Experimental results from devices fabricated with copper-contacts in this exemplary configuration show for NMOS up to 35% Idsat and 50% IDlin improvement, and for PMOS up to 30% Idsat and 50% IDlin improvement; when compared to conventional W processing in the same geometry. If the W processing is enhanced to the limit of the state of the art (i.e. configurations unrealistic for mass production), improvements are still seen for NMOS up to 15% Idsat and 25% IDlin improvement, and for PMOS up to 10% Idsat and 20% IDlin improvement; when compared to conventional W processing in the same geometry.

Although embodiments above focus mainly on FEOL processing, the same can be applied to BEOL processing without exceeding the scope of the embodiments of the present invention.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of forming a semiconductor device comprising:
   forming a gate electrode on a gate dielectric layer formed on a planar semiconductor substrate;
   forming a source region and a drain region on opposite sides of said gate electrode wherein said semiconductor device has a gate length defined as the distance between said source region and said drain region and a gate width perpendicular to said gate length, said source region and said drain region each having a length parallel to said gate width;
   forming a dielectric layer over said source region and said drain region;
   forming a trench opening in said dielectric layer over one of said source region and said drain region, said trench opening having a trench length and a trench width wherein said trench length is greater than said trench width and wherein said trench length is parallel to said gate width, said trench length extending said entire length of said one of said source region and said drain region; and
   filling the trench opening with a conductive material to form a contact.

2. The method of claim 1 wherein filling the trench opening with a conductive material comprises forming a barrier layer within the trench opening and forming a copper containing material on the barrier layer within the trench opening.

3. The method of claim 2 wherein the barrier layer performs as a silicide layer, a diffusion barrier for copper, and a nucleation layer for copper.

4. The method of claim 2 further comprising forming a metal silicide portion in the copper diffusion barrier.

5. The method of claim 1 further comprising forming a silicide layer on said source and drain regions.

6. The method of claim 5 wherein said silicide layer is formed prior to forming said dielectric layer and said trench like opening.

7. The method of claim 5 wherein said silicide layer is formed after forming said trench opening.

8. A method of forming a semiconductor device comprising:
   forming a gate electrode on a gate dielectric layer formed on a planar semiconductor substrate;

forming a source region and a drain region on opposite sides of said gate electrode wherein said semiconductor device has a gate length defined as the distance between said source region and said drain region and a gate width perpendicular to said gate length, said source region and said drain region each having a length parallel to said gate width;

forming a dielectric layer over said source region and said drain region;

forming a trench opening in said dielectric layer over one of said source region and said drain region, said trench opening having a trench length and a trench width wherein said trench length is greater than said trench width and wherein said trench length is parallel to said gate width, said trench length extending said entire length of said one of said source region and said drain region;

forming a barrier layer within the trench like opening; and depositing a copper containing material within the trench like opening to form a first contact to the semiconductor device.

9. The method of claim 8 wherein the barrier layer performs as a silicide layer, a diffusion barrier for copper, and a nucleation layer for copper.

10. The method of claim 8 further comprising forming a metal silicide portion in the copper diffusion barrier.

11. The method of claim 8 further comprising forming a silicide layer on said source and drain regions.

12. The method of claim 11 wherein said silicide layer is formed prior to forming said dielectric layer and said trench like opening.

13. The method of claim 11 wherein said silicide layer is formed after forming said trench opening.

* * * * *

UNITED STATES PATENT AND TRADEMARK OFFICE
CERTIFICATE OF CORRECTION

PATENT NO.        : 8,258,057 B2                          Page 1 of 1
APPLICATION NO.   : 11/396201
DATED             : September 4, 2012
INVENTOR(S)       : Kelin J. Kuhn et al.

It is certified that error appears in the above-identified patent and that said Letters Patent is hereby corrected as shown below:

On the Title Page

Item (22) delete "May 23, 2006" and insert -- March 30, 2006 --.

Signed and Sealed this
Fifth Day of August, 2014

Michelle K. Lee
*Deputy Director of the United States Patent and Trademark Office*